(12) United States Patent
Kyomasu et al.

(10) Patent No.: US 6,871,772 B2
(45) Date of Patent: Mar. 29, 2005

(54) WIRE BONDING APPARATUS

(75) Inventors: Ryuichi Kyomasu, Kodaira (JP); Yutaka Kondo, Musashimurayama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 50 days.

(21) Appl. No.: 10/616,774

(22) Filed: Jul. 10, 2003

(65) Prior Publication Data

US 2004/0007609 A1 Jan. 15, 2004

(30) Foreign Application Priority Data

Jul. 11, 2002 (JP) ........................................ 2002-202115

(51) Int. Cl.$^7$ ................................................ B23K 1/06
(52) U.S. Cl. .............................. 228/4.5; 228/8; 228/45; 228/1.1
(58) Field of Search .............................. 228/1.1, 45, 8, 228/9, 110.1, 180.5, 4.5, 102, 103, 245, 247

(56) References Cited

U.S. PATENT DOCUMENTS

| | | | | |
|---|---|---|---|---|
| 4,603,802 A | * | 8/1986 | Kurtz et al. | 228/1.1 |
| 4,903,883 A | * | 2/1990 | Thurlemann et al. | 228/1.1 |
| 5,156,320 A | * | 10/1992 | Yanagida | 228/102 |
| 5,169,050 A | * | 12/1992 | Montagu | 228/4.5 |
| 5,323,952 A | * | 6/1994 | Kato et al. | 228/102 |
| 5,385,288 A | * | 1/1995 | Kyomasu et al. | 228/1.1 |
| 5,411,195 A | * | 5/1995 | Yamazaki et al. | 228/1.1 |
| 5,486,733 A | * | 1/1996 | Yamazaki et al. | 310/323.18 |
| 6,098,868 A | * | 8/2000 | Mae et al. | 228/102 |
| 6,786,392 B2 | * | 9/2004 | Nogawa | 228/180.5 |

* cited by examiner

*Primary Examiner*—Tom Dunn
*Assistant Examiner*—Kevin McHenry
(74) *Attorney, Agent, or Firm*—Koda & Androlia

(57) ABSTRACT

A wire bonding apparatus with a bonding head that includes an ultrasonic transducer having a capillary at its tip end, piezo-electric elements that form a pair of complementary action type extension and retraction driving elements which cause the ultrasonic transducer to move with respect to a transducer holder, an impact detection sensor, and a Z motor which drives the transducer holder. The piezo-electric elements are arranged so that when one of them is driven to extend, the other is driven to retract. When the impact detection sensor detects that the capillary is lowered by the Z motor and comes into contact with a bonding object (semiconductor chip), the driving of the Z motor is stopped, and the piezo-electric elements are driven to the directions of extension and retraction in a complementary manner, thus swinging the ultrasonic transducer and moving the capillary upward.

10 Claims, 3 Drawing Sheets

WIRE BONDING APPARATUS

BACKGROUND OF THE INVENTION

1. Field of the Invention

The present invention relates to a wire bonding apparatus and more particularly to a high-speed wire bonding apparatus that alleviates the impact on the object of bonding.

2. Prior Art

Wire bonding techniques connect, with a thin metal wire, input-output terminals, etc. (bonding pads) of semiconductor chips such as LSIs, etc. and terminals (bonding leads) on packages or circuit boards on which these semiconductor chips are mounted. Wire bonding apparatuses are those used in such techniques.

The wire is held by being passed through a tubular body called a capillary. Accordingly, the wire bonding apparatus has a mechanism that is used for the relative positioning of the capillary and the semiconductor chip or circuit board. For example, in a typical ultrasonic type wire bonding apparatus, the capillary is disposed on the tip end of a long slender rod-shaped ultrasonic transducer which is formed in a shape that is suitable for the transmission of ultrasonic energy, and the apparatus has a raising-and-lowering mechanism that moves the ultrasonic transducer so that the capillary is raised or lowered with respect to the semiconductor chip, etc.

For example, a mechanism which holds the ultrasonic transducer (with the capillary disposed on the tip end) by means of a holder, and which moves this holder by means of a linear motor, is used as the above-described raising-and-lowering mechanism. The overall system of the raising-and-lowering mechanism is controlled by a servo technique, and contact with the bonding pad is accomplished by controlling the displacement, speed and acceleration, etc. of the tip end of the capillary. Then, a specified pressing force is applied to the capillary, and bonding is next accomplished by applying ultrasonic energy to the wire and bonding pad.

Speed at which the capillary is lowered with respect to the bonding pad, etc. is one important factor in determining the time of the wire bonding operation. It is preferable that this lowering speed be as high as possible. However, if the capillary is lowered at a high speed and strikes the bonding pad "as is", the IC chip, etc. will be damaged by the resulting impact. This impact depends on the magnitude of the inertia of the overall moving mechanism that lowers the capillary, and is a considerable impact in the case of current moving mechanisms that are equipped with an ultrasonic transducer, holder and raising-and-lowering mechanism, etc. Accordingly, a technique is used in which the lowering speed of the capillary is varied in stages, and the lowering speed is slowed after the tip end of the capillary has approached the bonding pad to within a certain proximity. In regard to the position at which the lowering speed is varied, a method is used in which variation in the thickness of the semiconductor chip or circuit board, etc. is taken into account; and, for example, the speed is reduced beginning at a position where the capillary has been lowered to a point that incorporates a safety margin in the amount of variation of the thickness.

Thus, in conventional techniques, control of the raising-and-lowering mechanism is made with the high-speed characteristics of the lowering speed of the capillary and alleviation of the impact taken into account.

In recent years, the size of LSI chips has increased and the number of bonding positions has increased; thus, there has been a need to increase the speed of wire bonding, and there has been a demand for an increase in the lowering speed of the capillary.

Furthermore, apart from the problem of damage to IC chips, there has been a demand for a substantial alleviation of the impact that acts on the object of bonding during the lowering action of the capillary as the ultra-miniaturization of electronic parts has progressed. In conventional techniques, wire bonding is performed on circuit boards, etc., whose lower portions are firmly supported by a carrying table; accordingly, there is no thought of these circuit boards, etc., flexing as a result of the impact that is applied during the lowering action of the capillary.

Recently, however, three-dimensional circuit assemblies have been designed for the purpose of ultra-miniaturization of electronic parts; and in such structures, there may be a need to perform wire bonding on a board that protrudes in the form of eaves, in which firm support cannot be obtained in the lower portion. In this case, since an impact is applied to the eave-form board when the capillary is lowered, wire bonding may become difficult as a result of problems such as flexing of the board and slipping of the capillary over the bonding pad, etc. Accordingly, there is a demand for a so-called impact-free wire bonding apparatus in which there is almost no impact during the lowering action of the capillary.

However, in conventional techniques, as a result of an increase in the lowering speed of the capillary and of an increase in the magnitude of the resulting impact, a method has been used in which the lowering speed is reduced after the tip end of the capillary has approached the bonding pad to within a certain proximity in order to alleviate the impact. Accordingly, if an attempt is made to alleviate the impact, then the speed of the capillary during lowering action is further reduced, hindering an increase in the speed of bonding.

As seen from the above, in conventional techniques, an increase in the speed of the capillary during lowering action and alleviation of the impact applied to the LSI chip by the capillary are conflicting requirements.

Furthermore, in conventional techniques, the mechanism that lowers the capillary has a complicated structure in which, for example, a capillary holding body such as an ultrasonic transducer is held by a holder, etc., and this holder is driven upward and downward. Accordingly, the inertia of the mechanism as a whole is considerable, and quick alteration of the lowering speed is difficult, so that there are limits to the extent to which the impact acting on the bonding pad can be alleviated.

SUMMARY OF THE INVENTION

It is an object of the present invention to solve such problems encountered in the prior art and to provide a wire bonding apparatus that achieves a greater alleviation of the impact that occurs during the lowering action of the capillary.

It is another object of the present invention to provide a wire bonding apparatus that achieves a greater increase in speed during the lowering action of the capillary.

It is still another object of the present invention to provide a wire bonding apparatus that achieves a greater increase in speed during the lowering action of the capillary and achieves a greater alleviation of the impact that occurs during the lowering action of the capillary.

The above objects are accomplished by a unique structure of the present invention for a wire bonding apparatus that comprises:

a carrying table which holds an object of bonding, a capillary holding body which has at its tip end a capillary through which a bonding wire passes, a holding body holder which holds the capillary holding body, a holder actuator which moves the holding body holder in relative terms with respect to the upper surface of the carrying table, thus moving the capillary so that the capillary is brought to contact with and separate from the carrying table, and a holding body actuator which is disposed between the holding body holder and the capillary holding body and which drives the capillary holding body in relative terms with respect to the holding body holder; and the holding body actuator causes the holder actuator to move the capillary upward when the capillary and the upper surface of said carrying table are brought to positionally close to each other.

As a result of this structure, the capillary holding body can move in relative terms with respect to the holding body older; and when the capillary is caused to approach or moved closer to the upper surface of the carrying table by the driving of the holder actuator, the capillary is moved upward by the holding body actuator so that the impact that occurs during the lowering action of the capillary is alleviated. In other words, the capillary is moved upward by the holding body actuator independently of the lowering speed of the capillary; and thus, both a greater increase in the speed of the capillary during the lowering action of the capillary and a greater alleviation of the impact can be achieved. Furthermore, since the driving of the capillary in the upward direction by the holding body actuator is applied only to the capillary holding body, this driving can be quickly accomplished. The term "approach" includes both an approaching movement, in which two objects are still separated, and contact, in which two objects are not separated.

Furthermore, the wire bonding apparatus of the present invention further include:

an impact detection sensor which detects an impact received by the capillary from the upper surface of the carrying table caused by a contact of the capillary with the upper surface of the carrying table and outputs a detection signal, and a control means that controls the driving of the holding body actuator based upon the detection signal.

As a result of this structure, the approach of the capillary to the upper surface of the carrying table, e.g., contact with the semiconductor chip via the wire, is detected by the impact detection sensor, and the capillary is moved upward.

Furthermore, in the wire bonding apparatus of the present invention:

the capillary holding body extends along the upper surface of the carrying table and has at its tip end the capillary that is disposed so as extend downward toward the upper surface of the carrying table, the holding body actuator is comprised of a pair of complementary action type extension and retraction driving elements that are attached between a pair of holding body side attachment positions, which are disposed on the capillary holding body so that the positions are separated in a direction of extension of the capillary holding body, and a pair of holder side attachment positions, which are disposed on the holding body holder at locations corresponding to the holding body side attachment positions, and the pair of complementary action type extension and retraction driving elements is arranged so that when one extension and retraction driving element makes an extension action, another element makes a retraction action.

As a result of this structure, the capillary at the tip end of the capillary holding body is caused to move upward by extending one of the complementary action type extension and retraction driving elements that are attached to the capillary holding body at a given spacing in the direction of extension of the capillary holding body and by retracting another one of the other complementary action type extension and retraction driving elements.

Furthermore, it is preferable to design so that:

the pair of complementary action type extension and retraction driving elements be disposed so that a normal line intersection point where a first normal line and a second normal line are crossed is located in a position that corresponds to the upper surface of the carrying table, wherein the first normal line extends from the holding body side attachment position of one of the extension and retraction driving elements in a direction perpendicular to a direction of an extension and retraction driving force that is applied to the holding body side attachment position, and the second normal line extends from the holding body side attachment position of another extension and retraction driving element in a direction perpendicular to a direction of an extension and retraction driving force that is applied to the holding body side attachment position; and the holding body actuator drives the capillary holding body to swing about the center of swing which is the normal line intersection point.

As a result of this structure, the capillary holding body can swing about the center of swing that is located more or less on the upper surface of the carrying table. Accordingly, the movement of the tip end of the capillary is oriented in the direction that is more or less perpendicular to the upper surface of the carrying table, so that slipping of the capillary over the upper surface of the semiconductor chip is prevented.

Furthermore, it is preferable that the center of swing be disposed between a position of the center of gravity of the capillary holding body and a position where the capillary is disposed.

As a result of this structure, the moment arising from gravity and inertia at the position of the center of gravity of the capillary holding body acts in a direction that aids the upward movement of the capillary when the capillary is moved upward by swing the capillary holding body. Accordingly, the upward movement of the capillary is quickly accomplished with a small driving force.

The holding body actuator is preferably a piezo-electric element. It is also preferable to design so that when the piezo-electric element is not making a relative movement of the capillary holding body with respect to the holding body holder, the piezo-electric element receives the impact acted on the capillary by the upper surface of the carrying table and outputs a detection signal.

As a result, the piezo-electric element can function as both an actuator and an impact detection sensor, and the number of constituent parts required can be reduced.

Furthermore, it is preferable that the capillary holding body be an ultrasonic transducer.

DETAILED DESCRIPTION OF THE INVENTION

Figure 1:
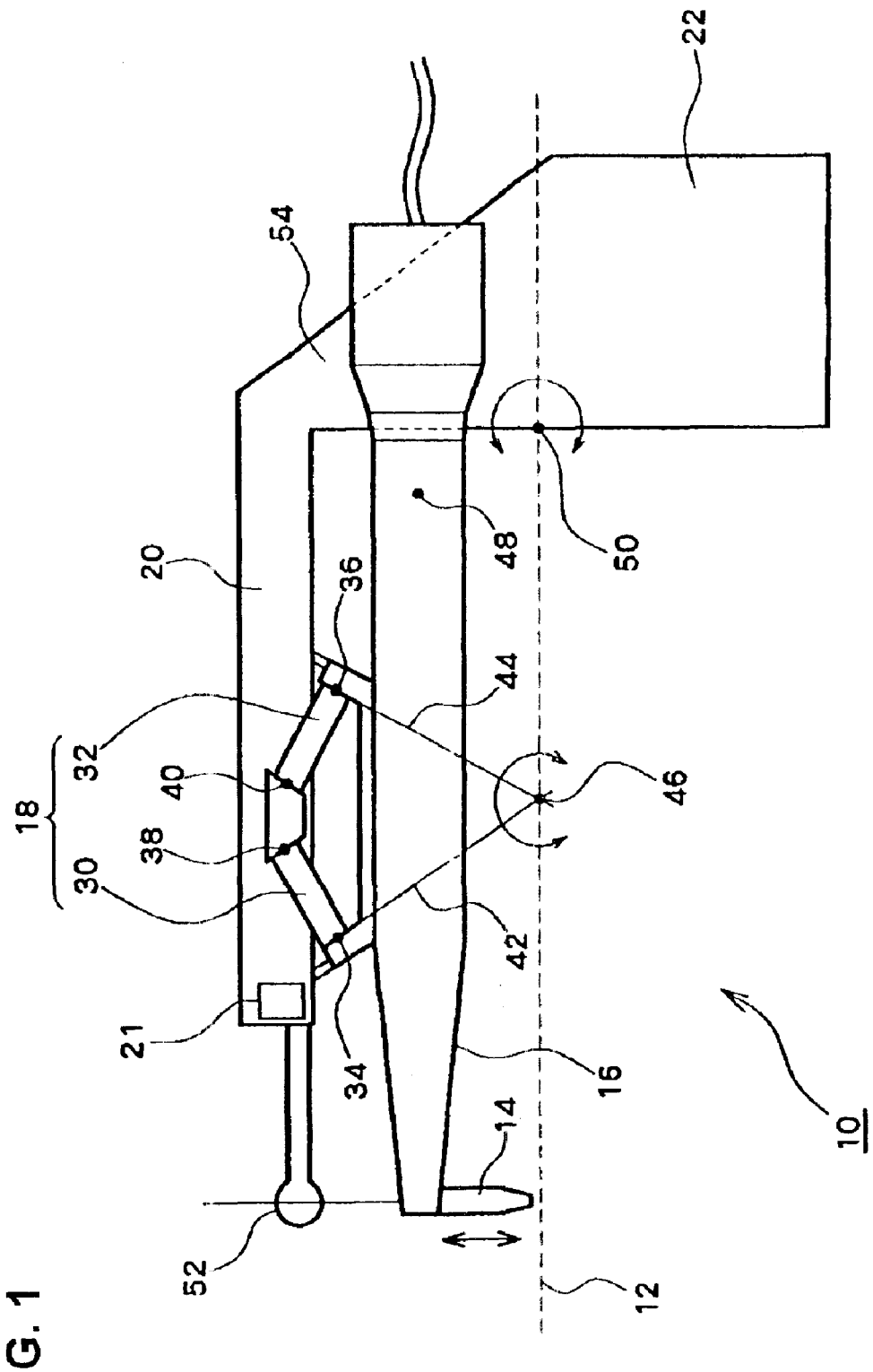
FIG. 1 is a side view of the bonding head in a wire bonding apparatus according to the one embodiment of the present invention.

One embodiment of the present invention will be described in detail below with reference to the accompanying drawings. FIG. 1 shows the bonding head 10 (including the mechanism that raises and lowers the capillary) from the side in a wire bonding apparatus to which the present invention is applied. Since the positional relationship of the bonding head 10 and the carrying table is important, the upper surface of the carrying table 12 is indicated by a broken line. An ultrasonic wire bonding apparatus that performs bonding between a wire and a bonding pad, etc., using ultrasonic energy is illustrated in the accompanying drawing; however, the wire bonding apparatus can be some other type of apparatus such as a heat and pressure bonding type wire bonding apparatus, etc.

The bonding head 10 comprises an ultrasonic transducer (capillary holding body) 16 which has a; capillary 14 on the tip end, a piezo-electric actuator (holding body actuator) 18 which is attached to the ultrasonic transducer 16, a bonding holder (holding body holder) 20 which holds the ultrasonic transducer 16 via the piezo-electric actuator 18, an impact detection sensor 21 which is attached to the bonding holder 20, and a Z motor (holder actuator) 22 which drives the bonding holder 20.

The capillary 14 is a tubular element through which a bonding wire passes. The ultrasonic transducer 16 is an energy converting-device which has the function of converting electrical energy into ultrasonic vibrations and transmitting the energy of the ultrasonic vibrations thus generated to the capillary which is at the tip end. The transducer 16 has a long slender rod shape, and it is shaped so as to be suitable for suppressing attenuation of the energy of the ultrasonic vibrations and efficiently transmitting this energy to the capillary. The electrical energy is supplied by a signal line from an ultrasonic wave generating control part (not shown).

The piezo-electric actuator 18 is disposed between the ultrasonic transducer 16 and the bonding holder 20, and it is an actuator which is used to cause relative movement of the ultrasonic transducer 16 with respect to the bonding holder 20. The piezo-electric actuator 18 has a pair of piezo-electric elements 30 and 32. These piezo-electric elements are attached to the ultrasonic transducer 16 at an inclination so that these elements face each other on the bonding holder 20 side. More specifically, the spacing between the attachment positions 34 and 36 of the respective piezo-electric elements on the ultrasonic transducer 16 side is set so as to be wider (larger) than the spacing of the attachment positions 38 and 40 on the bonding holder 20 side.

The respective piezo-electric elements 30 and 32 are extension and retraction driving elements which receive driving control signals from a raising-and-lowering mechanism driving control part (not shown) and extend and retract in the axial direction. The driving control is so-called complementary type driving control in which a control action is made so that when one of the piezo-electric elements is driven in the direction of extension, the other piezo-electric element is driven in the direction of retraction.

The attachment positions 34, 36, 38 and 40 of the respective piezo-electric elements 30 and 32 are disposed so that particular conditions are satisfied. More specifically, the attachment positions are selected along the direction of length of the long slender rod-form ultrasonic transducer 16 and in areas that cause little attenuation of the ultrasonic vibrations, e.g., positions in the vicinity of the nodes of the ultrasonic vibrations. Furthermore, such positions are selected so that the normal line intersection point 46 that constitutes a point of intersection between a normal line 42 and a normal line 44 is located more or less at the height of the upper surface (shown by broken line) of the carrying table 12 and between the position of the capillary and the position of the center of gravity 48 of the ultrasonic transducer 16. In this positioning, the normal line 42 is a line that extends from the attachment position 34 on the ultrasonic transducer 16 side in the direction perpendicular to the direction of extension and retraction of the piezo-electric element 30 (i.e., in the direction perpendicular to the axial direction of the piezo-electric element 30), and the normal line 44 is a line that extends from the attachment position 36 in the direction perpendicular to the direction of extension and retraction of the piezo-electric element 32 (i.e., in the direction perpendicular to the axial direction of the piezo-electric element 32).

When the pair of piezo-electric elements 30 and 32 are driven in the direction of extension and retraction in a complementary manner, the ultrasonic transducer 16 makes a swing motion; and the center of this swing motion is the normal line intersection point 46.

The bonding holder 20 holds the ultrasonic transducer 16 and the piezo-electric actuator 18 as an integral unit, and it has a function of being able to rotate about a rotating shaft 50 that is parallel to the upper surface (shown by broken line) of the carrying table 12. The rotating shaft 50 is set at a height that corresponds to the upper surface of the carrying table 12 in a direction that is perpendicular to the direction of length of the ultrasonic transducer 16. The bonding holder 20 has a shape that extends along the direction of length of the ultrasonic transducer 16, and a wire damper 52 is disposed in a position corresponding to the capillary 14. On the opposite end from the wire damper 52, a pair of leg portions 54 that face toward the upper surface (shown by broken line) of the carrying table 12 are disposed so that these leg portions 54 straddle the rear portion of the ultrasonic transducer 16. In the pair of leg parts 54, the bonding holder 20 is attached to the rotating shaft 50 so that the bonding holder 20 is free to rotate, and the bonding holder 20 is further connected to the Z motor 22. The attachment positions 38 and 40 of the piezo-electric actuator 18 are set between the position of the wire clamper 52 and the leg parts 54 so that the above-described conditions are satisfied.

The impact detection sensor 21 detects the impact that is received when the tip end of the capillary 14 contacts the object of bonding such as a semiconductor chip, etc., and it outputs this impact as a detection signal. For example, a commercially marketed shock sensor, etc. can be used as this sensor. The detection signal is inputted in a raising-and-lowering mechanism driving control part (not show). The impact detection sensor 21 is disposed between the wire damper 52 and the attachment position 38 of the piezo-electric actuator 18.

The Z motor 22 functions rotationally drive the bonding holder 20 about the rotating shaft 50. This Z motor 22 is a linear motor which has a conversion mechanism. The driving of the Z motor is made by way of supplying driving control signals from a raising-and-lowering mechanism controller (not shown).

The driving control of the Z motor 22 is divided into two main functions. One function is a capillary movement servo control that drives the bonding holder 20, piezo-electric actuator 18 and ultrasonic transducer 16 as an integral unit, thus controlling the displacement, speed and acceleration, etc. of the capillary 14 on the tip end of the ultrasonic transducer 16 so that a target value is tracked. A height which is lower than the upper surface of the semiconductor chip is selected as the target value; and a tracking servo action is made so that the capillary is moved at a designated speed up to this target value, contact between the tip end of the capillary and the upper surface of the semiconductor chip is detected by variations in the speed and acceleration, and the Z motor 22 is stopped. The other function is a function that applies a specific bonding load, i.e., pressing pressure, to the capillary after the tip end of the capillary has contacted the semiconductor chip.

Figure 2A:
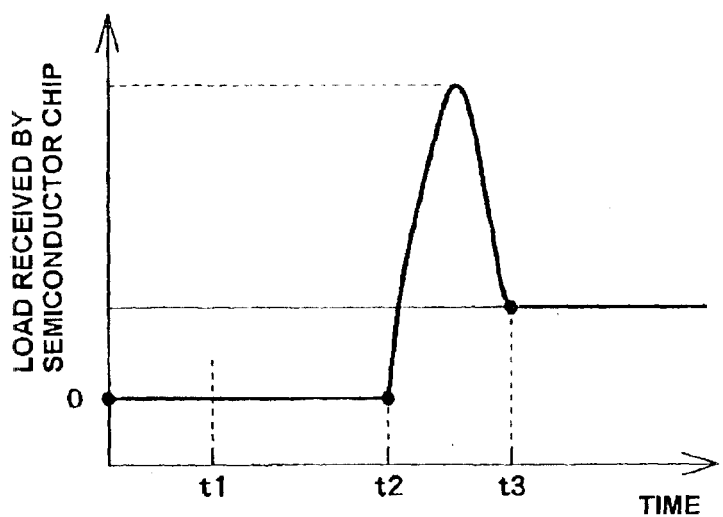
FIGS. 2A and 2B are graphs showing the relationship between the impact force and speed during the lowering action of the capillary in a conventional technique.

In the wire bonding apparatus of the embodiment shown in FIG. 1, control of the operation during the lowering action of the capillary is made by a raising-and-lowering mechanism controller (not shown). This control will be described with reference to FIGS. 2A through 3B. The variation over time of the load received by the semiconductor chip from the capillary is shown in FIGS. 2A and 3A, and the variation over time of the displacement of the tip end of the capillary is shown (for a common origin on the time axis) in FIGS. 2B and 3B. Accordingly, the magnitude of the impact during the lowering action of the capillary can be evaluated by FIGS. 2A and 3A, and the speed during the lowering action of the capillary can be evaluated by FIGS. 2B and 3B. Besides a semiconductor chip, the object of bonding may be a circuit board, etc.; and in the following description, a semiconductor chip will be used as an example of the object of bonding.

Figure 2B:
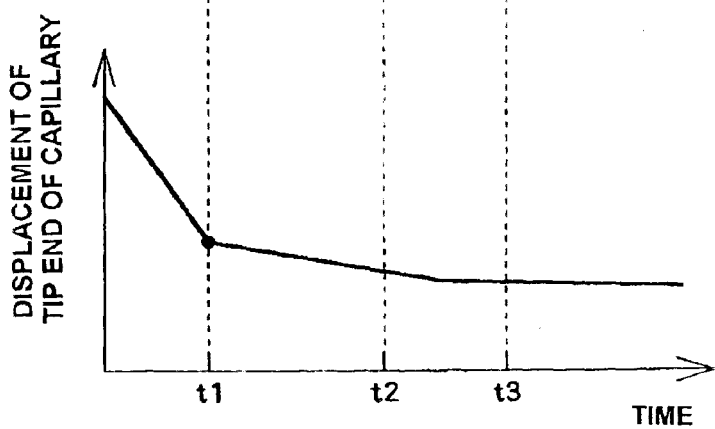
Figure 3A:
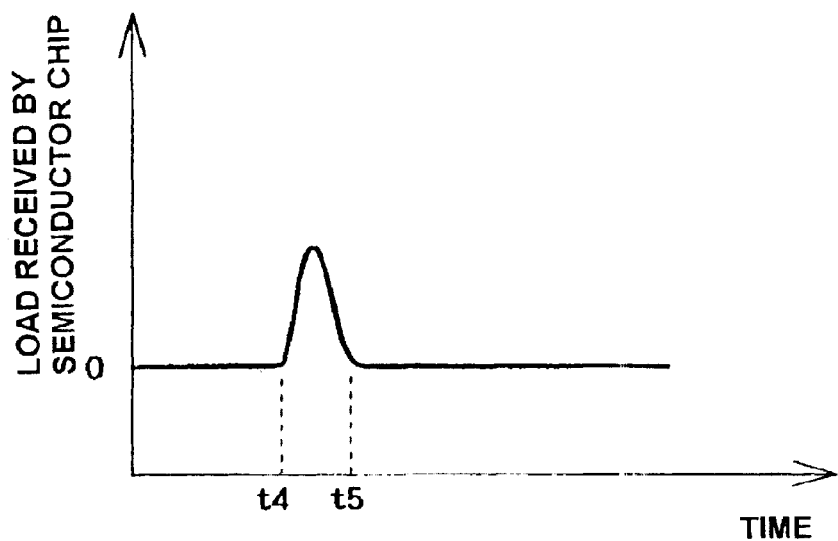
FIGS. 3A and 3B are graphs showing the relationship between the impact force and speed during the lowering action of the capillary in a wire bonding apparatus according to the embodiment of the present invention.

FIGS. 2A and 2B diagrams illustrating a case in which the capillary 14 is lowered toward the upper surface of the carrying table 12 by the driving of the Z motor 22, without driving the piezo-electric actuator 18. This corresponds to a conventional technique.

In FIGS. 2A and 2B, the capillary 14 is lowered at a high speed up to time t1. Then, beginning at time t1, the capillary is lowered with its speed reduced. At time t2, the capillary 14 contacts the semiconductor chip. Up to time t2, the load received by the semiconductor chip is zero; however, at time t2, the capillary 14 collides with the semiconductor chip, so that the semiconductor chip receives an impact force. After the impact force reaches a peak, this impact force decreases as a result of the elasticity and plastic deformation, etc. of the wire, etc. In this process, a bonding load is applied at time t3; afterward, there is a transition to a steady state. Thus, in cases where the capillary 14 is lowered by the driving of the Z motor 22 alone, the semiconductor chip receives a large impact force between time t2 and time t3. For instance, the peak value of this impact force may range from 500 mN (a weight of approximately 50 g) to 1000 mN (a weight of approximately 100 g). Furthermore, the magnitude of the bonding load is (for example) approximately 200 mN (a weight of approximately 20 g).

Between time t1 and time t2, the capillary 14 is gradually lowered. The lowering distance during this time period is, for example, approximately 70 microns (this distance is set with a margin that takes variation in the thickness of the semiconductor chip, etc. into account). The lowering speed is, for example, 1 to 5 min/sec. Accordingly, a time of 14 to 70 msec is required as the elapsed time between time t1 and time t2.

Figure 3B:
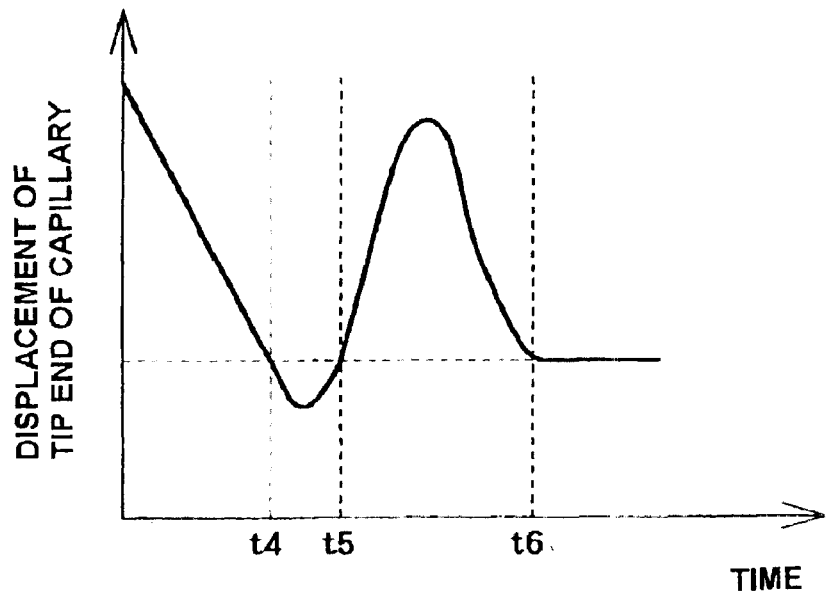

FIGS. 3A and 3B illustrate how the piezo-electric actuator 18 is driven when the capillary 14 has approached the upper surface of the carrying table 12 as a result of the driving of the Z motor 22. In FIGS. 3A and 3B, the conditions are shown form before and after the contact of the capillary 14 with the semiconductor chip.

In FIGS. 3A and 3B, at time t4, the impact detection sensor 21 outputs a detection signal; up to this time, the capillary 14 is lowered at a high speed. When the impact detection sensor 21 outputs a detection signal at time t4, the driving of the Z motor 22 is first stopped. Then, instead of this driving, the ultrasonic transducer 16 is caused to swing about the swing center (the normal line intersection point) 46 by the piezo-electric elements 30 and 32 that constitute the above-described pair of complementary action type extension and retraction driving element, and the capillary 14 begins to move upward.

More specifically, the lowering action of the capillary 14 by the Z motor 22 is stopped beginning at time t4; however, as a result of the inertia of the bonding holder 20, etc., the capillary 14 applies a downward-oriented impact force to the semiconductor chip, so that there is a further slight downward displacement in a state in which the tip end of the capillary 14 and the upper surface of the semiconductor chip are in contact. From time t4, the capillary 14 begins to move upward as a result of the swing drive of the piezo-electric elements 30 and 32 that constitute the above-described pair of complementary action type extension and retraction driving elements. Accordingly, the downward movement caused by this inertia is gradually slowed, and the tip end of the capillary 14 reaches its lowermost position at the time at which this movement is balanced with the upward movement caused by the swing drive. From the time at which this lowermost position is reached, the tip end of the capillary 14 begins to rise; and at time t5, the tip end of the capillary 14 returns to the height of the original upper surface position of the semiconductor chip, i.e., the height of the upper surface position of the semiconductor chip in a case where no impact force is received;

In other words, at time t5, the tip end of the capillary 14 is separated from the upper surface of the semiconductor chip. Accordingly, the load that is received by the semiconductor chip is only an impact force of extremely short duration from time t4 to time t5; and beginning at time t5, the load that is received returns to zero.

After making complementary drive that continues to move the capillary 14 upward "as is", the piezo-electric elements 30 and 32 that constitute the pair of complementary action type extension and retraction driving elements then make complementary drive in the opposite direction for an appropriate period of time, so that the ultrasonic transducer 16 swings in the opposite direction, and the tip end of the capillary 14 is again lowered. Then, at time t6, the tip end of the capillary 14 again contacts the upper surface of the semiconductor chip. The load that is received by the semiconductor chip at time t6, can be reduced to be negligible. Afterward, the bonding load is applied, and a specified ultrasonic energy is supplied, so that bonding is performed between the wire and the bonding pad of the semiconductor chip.

The object which the piezo-electric elements 30 and 32, which are the pair of complementary action type extension and retraction driving elements, drives is the ultrasonic transducer 16 whose inertia is smaller than that of the Z motor 22 and bonding holder 20. Accordingly, the upward movement at time t4 can be made quickly, and a soft landing is also possible when re-contact occurs at time t6. In this way, the load that is received by the semiconductor chip can be alleviated. In the shown embodiment, the magnitude of the impact force received by the semiconductor chip can be reduced to approximately 50 mN (a weight of approximately 5 g) or less. In other words, the magnitude of the impact force can be, reduced to a value of 1/5 to 1/10 the magnitude of the impact force in a conventional technique.

Furthermore, in regard to the speed of the capillary during lowering action, the capillary can be lowered at a high speed from beginning to end, without varying the speed in two stages as in a conventional technique. Accordingly, the low speed period required in a conventional technique can be eliminated, so that the high speed characteristics during the lowering action of the capillary can be greatly improved.

In the driving control sequence described above, the upward movement of the tip end of the capillary 14 continues after the tip end of the capillary 14 is separated from the upper surface of the semiconductor chip, and then the tip end of the capillary 14 is re-lowered. However, other forms of driving control, e.g., control in which the driving of the piezo-electric elements that are the pair of complementary action type extension and retraction driving elements is stopped beginning at time t5, is also possible. In this case, the impact force received by the semiconductor chip returns to zero, and the tip end of the capillary 14 is more or less at the height of the upper surface position of the semiconductor chip. Accordingly, the bonding load is applied in this state.

In the shown embodiment, the height of the swing center is set more or less at the height of the upper surface of the carrying table. In this case, as a result, when the tip end of the capillary contacts the upper surface of the semiconductor chip, the height of the tip end of the capillary is more or less the same as the height of the swing center, even with the thickness of the semiconductor chip, etc. taken into account. In this state, the capillary moves upward from the upper surface of the semiconductor chip, and then again makes a soft landing. Accordingly, the movement of the tip end of the capillary can be oriented so that this movement is more or less perpendicular to the upper surface of the semiconductor chip, and the capillary can thus be prevented from slipping over the upper surface of the semiconductor chip.

Furthermore, in the embodiment, the position of the swing center is set so as to be is disposed between the position of the capillary and the position of the center of gravity of the ultrasonic transducer. As a result of such this arrangement, the position of the tip end of the capillary and the position of the center of gravity of the ultrasonic transducer are located on opposite sides from each other, with the attachment position of the piezo-electric actuator located between these positions. Accordingly, considering a case where the capillary is moved upward, the swing direction of the ultrasonic transducer is a direction that pulls the position of the center of gravity of the capillary holding body downward, so that the moment arising from gravity and inertia acts in a direction that aids the upward movement of the capillary. Accordingly, the upward movement of the capillary can be accomplished quickly with a small driving force.

In the embodiment, the contact between the capillary and the semiconductor chip is detected by an impact detection sensor. Besides such a configuration, it is also possible to detect the proximity of the capillary and semiconductor chip by a method in which the gap between the capillary and object of bonding is detected by a proximity sensor, or a method which uses an encoder, etc., that is installed on the Z motor and used for position detection.

Furthermore, in the shown embodiment, the impact detection sensor is independently employed. However, it is also possible to use a piezo-electric element used as a complementary action type extension and retraction driving element as an impact detection sensor. For example, during periods when the piezo-electric elements are not being used as complementary action type extension and retraction driving elements, i.e., when a relative movement of the ultrasonic transducer with respect to the bonding holder is not being made, such piezo-electric elements can be used as an impact detection sensor that detects the impact received by the capillary from the upper surface of the carrying table and outputs a detection signal.

As seen from the above, the wire bonding apparatus according to the present invention alleviates the impact during the lowering action of the capillary to a greater extent. In addition, the speed of the capillary during lowering action is further increased.

What is claimed is:

1. A wire bonding apparatus comprising:
    a carrying table which holds an object of bonding,
    a capillary holding body which has at its tip end a capillary through which a bonding wire passes,
    a holding body holder which holds said capillary holding body,
    a holder actuator which moves said holding body holder in relative terms with respect to an upper surface of said carrying table, thus moving said capillary so that said capillary is brought to contact with and separate from said carrying table, and
    a holding body actuator which is disposed between said holding body holder and said capillary holding body and moves said capillary holding body in relative terms with respect to said holding body holder; and wherein
    said holding body actuator causes said holder actuator to move said capillary upward when said capillary and said upper surface of said carrying table are brought to positionally close to each other.

2. The wire bonding apparatus according to claim 1, further comprising:
    an impact detection sensor which detects an impact received by said capillary from said upper surface of said carrying table caused by a contact of said capillary with said upper surface of said carrying table and outputs a detection signal, and
    a control means that controls a driving of said holding body actuator based upon said detection signal.

3. The wire bonding apparatus according to claim 1, wherein
    said capillary holding body extends along said upper surface of said carrying table and has at its tip end a capillary that is disposed so that said capillary extends downward toward said upper surface of said carrying table,
    said holding body actuator has a pair of complementary action type extension and retraction driving elements that are attached between a pair of holding body side attachment positions, which are disposed on said capillary holding body so that said positions are separated in a direction of extension of said capillary holding body, and a pair of holder side attachment positions, which are disposed on said holding body holder at locations corresponding to said holding body side attachment positions, and
    said pair of complementary action type extension and retraction driving elements is arranged so that when one extension and retraction driving element makes an extension action, another element makes a retraction action.

4. The wire bonding apparatus according to claim 3, wherein said pair of complementary action type extension and retraction driving elements is disposed so that a normal line intersection point where a first normal line and a second normal line are crossed is located in a position that corresponds to said upper surface of said carrying table, said first normal line extending from said holding body side attachment position of one extension and retraction driving element in a direction perpendicular to a direction of an extension and retraction driving force that is applied to said holding body side attachment position, and said second normal line extending from said holding body side attachment position of another extension and retraction driving element in a direction perpendicular to a direction of an extension and retraction driving force that is applied to said holding body side attachment position; and said holding body actuator causes said capillary holding body to swing about a center of swing which is said normal line intersection point.

5. The wire bonding apparatus according to claim 4, wherein said center of swing is disposed between a position of a center of gravity of said capillary holding body and a position where said capillary is disposed.

6. The wire bonding apparatus according to any one of claims 1 through 5, wherein said capillary holding body is an ultrasonic transducer.

7. The wire bonding apparatus according to any one of claims 1 through 5, wherein said holding body actuator is a piezo-electric element.

8. The wire bonding apparatus according to claim 7, wherein when said piezo-electric element is not making a relative movement of said capillary holding body with respect to said holding body holder, said piezo-electric element receives an impact acted on said capillary by said upper surface of said carrying table and outputs a detection signal.

9. The wire bonding apparatus according to claim 8, wherein said capillary holding body is an ultrasonic transducer.

10. The wire bonding apparatus according to claim 7, wherein said capillary holding body is an ultrasonic transducer.

* * * * *